US008959008B2

(12) United States Patent
Olsen et al.

(10) Patent No.: US 8,959,008 B2
(45) Date of Patent: Feb. 17, 2015

(54) METHOD FOR DYNAMICALLY SWITCHING ANALYSES AND FOR DYNAMICALLY SWITCHING MODELS IN CIRCUIT SIMULATORS

(75) Inventors: Michael Claus Olsen, Cortlandt Manor, NY (US); Jie Deng, Wappingers Falls, NY (US); Terence B. Hook, Jericho, VT (US); Madan Mohan Naga Nutakki, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 153 days.

(21) Appl. No.: 13/023,559

(22) Filed: Feb. 9, 2011

(65) Prior Publication Data

US 2012/0203532 A1    Aug. 9, 2012

(51) Int. Cl.
*G06F 17/50* (2006.01)
(52) U.S. Cl.
CPC ........ *G06F 17/5022* (2013.01); *G06F 17/5036* (2013.01)
USPC .......................................................... 703/14
(58) Field of Classification Search
CPC .................... G06F 17/5022; G06F 17/5036
See application file for complete search history.

(56) References Cited

U.S. PATENT DOCUMENTS

| | | | |
|---|---|---|---|
| 7,822,590 B2* | 10/2010 | Kundert | 703/14 |
| 7,827,017 B2* | 11/2010 | Kundert | 703/14 |
| 8,200,461 B2* | 6/2012 | Fang | 703/2 |
| 8,224,636 B2* | 7/2012 | Kundert | 703/14 |
| 2006/0248518 A1* | 11/2006 | Kundert | 717/140 |
| 2011/0071812 A1* | 3/2011 | Fang | 703/14 |

OTHER PUBLICATIONS

Synopsys, HSPICE® Reference Manual: Commands and Control Options, Version E-2010.12, Dec. 2010, pp. xxi and 363.*
David F. Bacon, Susan L. Graham and Oliver J. Sharp, Compiler Transformations for High-Performance Computing, EECS Department, University of California, Berkeley, Technical Report No. UCB/CSD-93-781, Nov. 1993.*
A. Sakamoto, Machine translation of detailed description for JP 11110420 A, Japanese Patent, Apr. 1999.*

(Continued)

*Primary Examiner* — Omar Fernandez Rivas
*Assistant Examiner* — Robert Brock
(74) *Attorney, Agent, or Firm* — H. Daniel Schnurmann; Ira D. Blecker (57) ABSTRACT

Performing a transient analysis with a compact FET model that is predominantly intended for DC analysis, such as an IDDQ leakage model, to enable toggling logic states in sequential logic circuits that cannot otherwise be examined in a DC analysis. An embodiment enables examining the DC or AC conditions of any logic state of any logic circuit in a DC or AC analysis, and additionally, it eliminates a potentially long execution time of a transient analysis with a DC model. Further solved is the present need to run two simulations and to maintain two netlists in order to overcome being unable to toggle certain logic states in the DC analysis. The invention achieves the aforementioned in a single simulation with a single netlist that calculates the DC operating circuit conditions with a model A on the fly at predetermined times or in certain logic states, during a transient analysis with a model B.

13 Claims, 6 Drawing Sheets

(56) References Cited

OTHER PUBLICATIONS

Authors Unknown, HSPICE® Reference Manual: Commands and Control Options, Version E-2010.12, Synopsys, Dec. 2010, pp. xxi, 150-153, and 363.*

Authors Unkown, Lecutre 19, Oklahoma State University, http://ieeeb.okstate.edu/lecturenotes/EET-4654%20Microwaves/Lecture%2019%20Resonant%20Circuit%20Design.pdf as retrieved for webarchive.org for Jun. 6, 2010.*

* cited by examiner

1. //Include paths
2. Include PSP model library but use only for transient analysis
3. Include IDDQ model library but use only for DC analysis
4.
5. //Model instantiations
6. Instantiate FET from PSP model library but only for transient analysis
7. Instantiate FET from IDDQ model library but only for DC analysis
8.
9. //Transient analysis command
10. Perform transient analysis at temperature=25C and Vdd=1.0V
11.
12. //DC analysis command
13. Sweep temperature=-10C,25C,85C but only for DC analysis
14. Sweep Vdd=0.9V,1.0V,1.1V but only for DC analysis
15. Perform DC analysis and use operating conditions from transient analysis at times = '<T0>' '<T1>' ... '<TN>'
16.
17. //Save DC leakage to log file
18. Print leakage current in Vss supply from DC analysis

```
1.  #Step 1: Transient analysis w/fast model
2.  spice  my_ckt_tran.sp
3.
4.  #Step 2: File renaming
5.  mv  my_ckt_tran.ic0@1e-09  my_ckt_tran.ic0
6.  mv  my_ckt_tran.ic0@2e-09  my_ckt_tran.ic1
7.  mv  my_ckt_tran.ic0@3e-09  my_ckt_tran.ic2
8.  mv  my_ckt_tran.ic0@4e-09  my_ckt_tran.ic3
9.
10. #Step 3: DC analysis w/slow model
11. spice  my_ckt_dc.sp
```

METHOD FOR DYNAMICALLY SWITCHING ANALYSES AND FOR DYNAMICALLY SWITCHING MODELS IN CIRCUIT SIMULATORS

FIELD OF THE INVENTION

The present invention relates to Design Automation, and more particularly, to a method and a system for switching circuit simulators on the fly, increasing the speed of execution, minimizing the simulator's overhead, and compacting FET models.

BACKGROUND AND RELATED ART

New compact FET models under development are typically developed using preferably Verilog-A high-level programming language. But Verilog-A models are oftentime executed using slower than already fully developed and matured compact models that were previously translated into the C programming language, optimized and tightly integrated into the simulators, also known as built-in models. For instance, when comparing transient simulation or DC simulation runtimes in an HSPICE simulator between a built-in version and the Verilog-A version of a fully developed and matured PSP v102.3 compact FET model, it was found that the built-in version was executed 8 to 12 times faster.

There are some compact models, like a dedicated IDDQ (quiescent supply current) leakage model, that should ideally only be used in a DC analysis since they may be inaccurate with respect to predicting the active current and the signal timing. However, a model like the IDDQ leakage model is typically used to predict the quiescent leakage of logic circuits in various logic states. Unfortunately, circuit designers presently do not have the option to toggle all the states of sequential logic circuits which states are a function of the previous states. Thus, circuit designers are presently forced to run an IDDQ leakage model in a transient simulation. This, however, can be unreasonably time consuming, particularly for large circuits or when examining hundreds of smaller logic circuits in a standard cell library.

Present approaches to reduce simulation runtime can be divided into three categories: code restructuring, approximations and circuit/scope reduction. Code restructuring includes avoiding redundant calculations, limiting loops, limit function calls, use of macros, limit or clever use of math function, and the like. Approximations include series expansion of equations, using simpler expressions, and limit variable ranges. Circuit/scope reduction includes reducing the characterization of circuits into circuit sub-blocks and to consider only a subset of PVT (Process Voltage Temperature) corners and logic states and then extrapolate to the full circuit and complete set of PVT corners and logic states. Of these three methods, the circuit/scope reduction offers the most significant runtime improvement, but at the highest cost of loss of accuracy.

With respect to the first two approaches, regarding code restructuring and approximations, the aforementioned methods make the code less readable and more difficult to modify. Since code readability and ease of modifying the code is of significant importance during development, they cannot be efficiently and practically addressed. In addition, high-level languages like Verilog-A have limited capability for making calls to external functions that may help to optimize the execution.

A second problem requiring attention revolves around a designer wanting to accurately predict in any logic state signal regimes, such as the active current, the signal timing and the IDDQ leakage, designers may have to run one or more compact models in at least two more different simulations. For accurate prediction of the active current and signal timing, the designer can use any of existing models, such as BSIM, PSP, HiSim, EKV and the like. For IDDQ leakage, there is presently no industry standard. However, such models are likely under development due to the increasingly important contribution of the IDDQ leakage current to the total energy consumption. But even if a single compact model would be capable of accurately predicting all three current regimes, in all likelihood it would come at the expense of increased complexity and increased execution time, neither of which is an attractive trade-off.

Regardless as to whether the designer would want to use a single model to predict all three signal regimes in the logic states of a sequential circuit, the designer might still, currently, require to run two simulations, i.e., a transient simulation and an additional DC analysis, to reduce the overall runtime, because true DC conditions may require an unacceptable long transient simulation time for signal stabilization, particularly if the time constants are large.

It should be noted that from various simulator reference manuals, it would seem that it should be possible to mix various analyses and models within a single netlist through the use of the HSPICE alter command and by saving operating conditions during a transient simulation and subsequently loading the operating conditions as initial conditions in a DC analysis. However, it is not possible to do it. Firstly, once a transient analysis has been specified, e.g., at the top level, and a DC analysis is specified in the first alter command, it cannot prevent that the transient analysis be repeated following an alter command nor that the saving of the operating points is repeated. This is a significant waste of runtime if the designer only intends to run the transient analysis once and have the operating conditions saved once, and both done at the top level. Secondly, it is impossible to load initial conditions files successively in an automatic fashion in the alter command due to file extension assumptions built into the simulators. One may therefore conclude that present simulators are simply not built to enable designers to control the fine-grain execution of a multiple of analyses.

Another problem with present simulators is that each time a new model library is specified in an alter section, the simulator needs to read the models and the circuit, and then error check it. This is done even though the same libraries are loaded repeatedly in an alternating fashion, resulting in having serious consequences on the runtime for very small circuit sizes, where the read in time dominates, and for very large circuit sizes, where error checking time is preponderant.

Therefore there is a need for a method to speed up the simulation of compact models that, for example, are available only as non built-in models and compact models that are under development such as compact FET models being developed in Verilog-A.

There is a further need to enhance the circuit simulator to enable it to switch analysis types and compact MOSFET models on the fly to obtain among other things all the required information related to the three current regimes, reducing runtime to obtain the IDDQ leakage.

Moreover, there is a need to achieve the foregoing more conveniently during a single simulation and using a single netlist with simple notation.

Furthermore, there is a need to accomplish the aforementioned requirements in a fast and effective manner in order to eliminate redundant time spent on reading in and error checking models and circuits that have already been previously read in and error checked and to eliminate unnecessary repetitive rerunning of analyses.

BRIEF DESCRIPTION OF THE DRAWINGS

The present invention will be understood and appreciated more fully from the following detailed description of the invention, taken in conjunction with the accompanying drawings of which.

SUMMARY

Embodiments of the present invention provide a method and a system enabling a circuit simulator to toggle any logic state of any logic circuit in a DC analysis, including logic states of sequential circuits which cannot presently be toggled in a DC analysis.

In one aspect, the invention provides a method for performing a circuit simulation that dynamically swaps analyses types and compact models, the method including: a) using a computer, running a first time based analysis using a first compact model until reaching a predetermined time and saving operating circuit conditions of the predetermined time; b) suspending the first time based analysis at the predetermined time, loading the saved operating circuit conditions as initial conditions for a second analysis with a second compact model, and running the second analysis to completion; c) updating an index to select a next corresponding predetermined time; and d) repeating steps a) through c) until terminating the first time based analysis.

In another aspect, the invention provides a system for performing a circuit simulation that dynamically swaps analyses types and compact models, the system including: a) using a computer, running a first time based analysis step using a first compact model until reaching a first predetermined time and saving operating conditions at the first predetermined time; b) temporarily suspending the first time based analysis step; c) running a second analysis with a second compact model and loading the saved operating conditions; d) updating an index by selecting the next corresponding predetermined time; and e) repeating steps a) through d) until an end of the time based analysis with the first compact model is reached.

In still another aspect, the method includes switching analysis types and compact models within a single simulation execution step, the method including: a) starting the overall simulation with a transient simulation using a fast compact FET model until the first relevant state and logic level is reached; b) temporarily suspending the transient simulation and saving the simulator's transient execution context (TEC) in an TEC memory block and also saving the circuit's operating conditions in an IC memory block; c) switching from the fast compact FET model to a slower, but more accurate, compact FET model; d) temporarily running a DC simulation using the present operating conditions from the transient simulation to rapidly converge on the DC conditions of the present logic state, including obtaining the leakage current; e) saving a state identifier and the DC conditions in a file, including the leakage current; f) switching from the slow, accurate compact FET model to the fast compact FET model; g) loading the TEC and IC memory blocks and resuming the transient simulation until the next relevant logic state and logic level is reached; h) repeating the above steps until the last relevant logic state and logic level is reached.

In still another aspect, the combined runtime of the transient analysis with the fast built-in model and the DC analysis with the slow leakage model can be significantly smaller when compared to using the slow leakage model entirely in a transient simulation. Additionally, the DC operating conditions of any logic state in any conceivable logic circuit can now be examined.

In yet another aspect, the ability of a simulator to temporarily "go off on a tangent" during a transient analysis to calculate the IDDQ leakage current with a different compact model in a single netlist setting is convenient and fits into the standard approach that circuit designers use netlists to simulate circuits.

In still a further aspect, an embodiment of the invention enables simulator-level instantiation and de-instantiation of a transistor model during an analysis as a function of simulation variables, such as the terminal voltages. In another related embodiment, a circuit-level selection and deselection of the transistor model is provided that employs circuit-functional switches, and which is controlled by circuit state variables to enable one of two, or more, transistors connected in parallel. The process as described enhances the accuracy of predicting leakage current, ON currents and timing information.

GLOSSARY OF TERMS

References in the specification to the notation <x> indicate a variable x.

References in the specification to the term "compact model" indicate a compact MOSFET model but could also refer to other transistor type models as well as passive models and the likes. It could also make reference to models that describe the behavior of other electrical, electro-mechanical, mechanical, or other physical devices. In the same line of thought, the term "simulator" typically indicates a circuit simulator but it could also refer to other types of simulators.

References in the specification to the term "analysis" include any type of circuit analysis such as transient, DC and AC analyses, but are not limited thereto.

References in the specification to the term "simulation time" indicate the simulation time of a transient analysis, which is typically in the range of nanoseconds to milliseconds, as opposed to the processing, execution or computing time, also referred to as the runtime, which is typically in the range of seconds to hours, but is not limited thereto.

References in the specification to the term "netlist" is an input file to the simulator that describes the circuit to be simulated, the analysis types, various circuit specific controls like power supplies and temperature as well as simulator controls and input/output controls.

References in the specification to the term "circuit topology" indicate the form taken of the nodes of the circuit as well as the qualitative DC functionality of the nodes. Strictly speaking, in the mathematical sense of the term "circuit topology", if a resistor that connects node A and node B is replaced with a capacitor, the topology remains the same. However, in our definition since the DC relationship between nodes A and B has changed, functionally speaking the topology is no longer the same.

References in the specification to the term "time-based analysis" indicate but are not limited to a circuit simulation analysis, such as a transient analysis and an AC analysis.

References in the specification to the term "securing", in for example, securing the transient execution context, indicates either locking and preparing the context for later use or saving the context somewhere, e.g. memory, file or database.

References in the specification to the term "restoring", in for example, restoring the transient execution context, indicate either a literal act of restoring the context from one storage place to another storage place, or returning to a place in memory where the context resides, but is not limited hereto.

DETAILED DESCRIPTION

Detailed embodiments of the present invention are disclosed hereinafter. However, it is to be understood that the disclosed embodiments are merely illustrative in nature. In addition, each of the examples given in connection with the various embodiments of the present invention is intended to be illustrative, and not restrictive.

A circuit simulator switches device models and switches analysis types during simulation. For illustrative purposes, a single netlist is used to embody the present invention.

Figure 1:
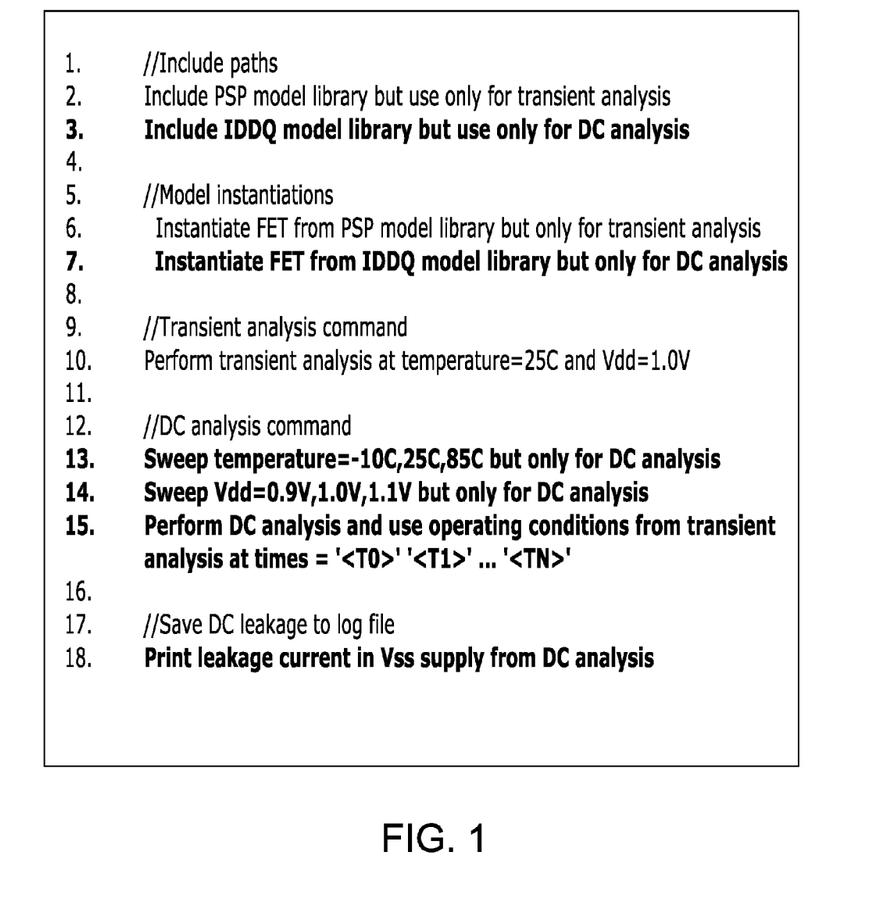
FIG. 1 illustrates an example of a netlist using new simulator commands needed to support an embodiment of the present invention.

Referring to FIG. 1, a netlist is shown that illustrates new simulator instructions, which for clarity are shown in bold, with the line numbers included in the netlist. Only key simulator instructions and circuit controls have been included in the netlist to clearly distinguish the present invention from existing simulator capabilities. Thus, typical circuit controls such as power supplies, stimuli, temperature, sub-circuit calls and the likes, as well as simulator controls have been left out.

Still referring to FIG. 1, in one embodiment, the invention uses two different compact models, namely a PSP model and an IDDQ model, as indicated by the two include paths in line 2-3 and the two model instantiation calls in line 6-7. Presently, two model instantiations would result in both models being used simultaneously in the circuit. In one embodiment, however, the first model instantiation in line 6 is only used in the transient analysis while the second model instantiation in line 7 is only used in the DC analysis. In order to demonstrate a faster runtime when compared to only running a transient simulation with the IDDQ model, the PSP model must execute faster than the IDDQ model. Next, in line 10, the simulator is instructed to perform a regular transient analysis using the compact model from line 6. In addition, the DC analysis instruction in line 15 tells the simulator that N operating conditions (i.e., circuit node voltages) need to be saved during the transient analysis so that the operating conditions can be used as initial conditions for the DC analysis. Furthermore, the sweep instructions in line 13-14 are specific to the DC analysis. In the following, the term OP(Ti) is used to represent the operating points at times Ti. The DC analysis and OP(Ti) may be used in two different ways, as will be described hereinafter. Note that OP(Ti) can include all conceivable node voltages, including those pertaining to power supplies and stimulus signals. It is worth noting the absence of alter commands in the netlist which are not needed in the preferred embodiment.

Still referring to FIG. 1, lines 13-15 demonstrate enhancements in which, during the DC analysis only, process-voltage-temperature (PVT) corners are examined. The transient analysis is only run for whatever PVT corner was set with existing simulator commands. Preferably, and in the particular example in FIG. 1, it would be preferable to only run the nominal corner at P=TT, V=nominal Vdd and T=25° C. This is a significant capability for the DC analysis, since the operating point during transient analysis is computed only once. Thus, subsequently it saves runtime in the DC analysis at all the sweep conditions since OP(Ti) is close to the final solution in that the simulator only needs a couple of iterations to arrive to the final solution. Finally, in line 18, the simulator is instructed to print out the current in the Vss power supply, preferably limiting it to only the DC analysis.

Figure 2:
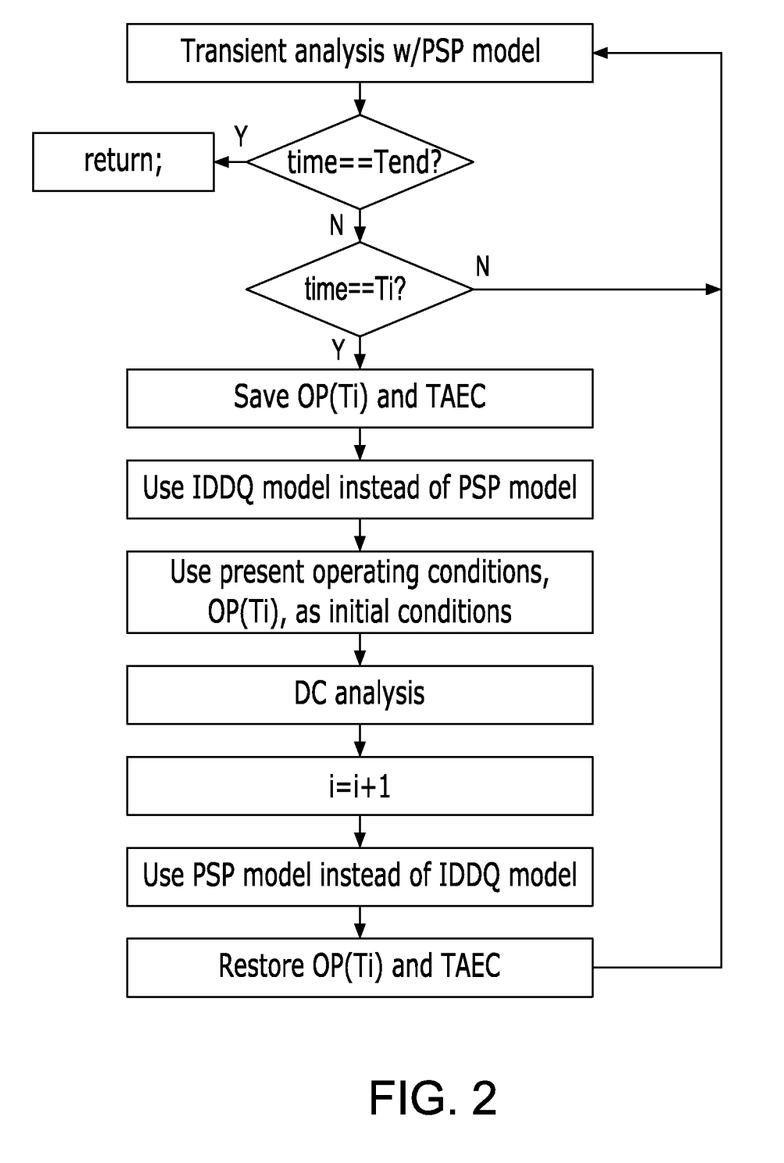
FIG. 2 is a flow chart of an embodiment of the invention.

In a first embodiment, referenced Method 1, the DC analysis instruction in line 15 (FIG. 1) is used in FIG. 2, wherein the simulator, during the transient analysis with the PSP model, saves the instantaneous operating point OP(Ti) at time Ti. It further saves or locks the simulator transient analysis execution context (TAEC) in a TAEC memory block, temporarily suspending the transient analysis to perform a DC analysis with the IDDQ model using OP(Ti) as initial conditions for the circuit. Upon completion of the DC analysis, the transient analysis resumes with the PSP model after restoring or returning to the simulation TAEC context and reloads OP(Ti) as the initial conditions. In an embodiment, the PSP and IDDQ models can either coexist in memory or be swapped in and out of the memory when needed, as will be described hereinafter.

Model Coexistence

When the circuit is read into memory, it can be organized in a main circuit object pointing to an interconnection matrix of various circuit components as well as containing component objects pointing to specific individual model objects, e.g., to resistor1, resistor2, FET1, FET2, FET3, capacitor1, and the like. By way of illustration, if there are, e.g., 1,000 components in the circuit, then there are 1,000 component objects belonging to the main circuit object. In order for the models to coexist, two sets of FET models need to be loaded into memory. The component objects for the FETs can contain two FET pointers, one to each of the PSP and IDDQ models. When the PSP and IDDQ models switch, the simulator simply flips a parameter switch when calling the FET component object to select the proper FET pointer, i.e., FET model. The advantage of model coexistence is that it is faster. The disadvantage is that it requires additional computer memory to simultaneously contain two sets of FET models.

Model Swapping

Model swapping is slower but generally requires less computer memory. Model swapping can be facilitated using the same main circuit object used for model coexistence except the FET component object that only contains one FET pointer. When the PSP and IDDQ models are switched, a new model is loaded into memory and the FET pointers are updated to point to the specific locations of the new model set. The reloading and FET pointer update occur repeatedly as the simulation switches between models. Reloading repeatedly will slow down the simulation.

Referring now to the transient analysis routine and the DC analysis routine, they generally require only a small amount of memory. Therefore, the analysis routines can and should coexist in memory without any penalty of any sort. Furthermore, the transient analysis routine could exist in computing thread A, and the DC analysis routine could exist in thread B. Thread A decides when to launch thread B. While thread B runs, thread A is suspended or left waiting. In an embodiment, thread A resumes execution only after the DC analysis in thread B has run to completion.

Figure 3:
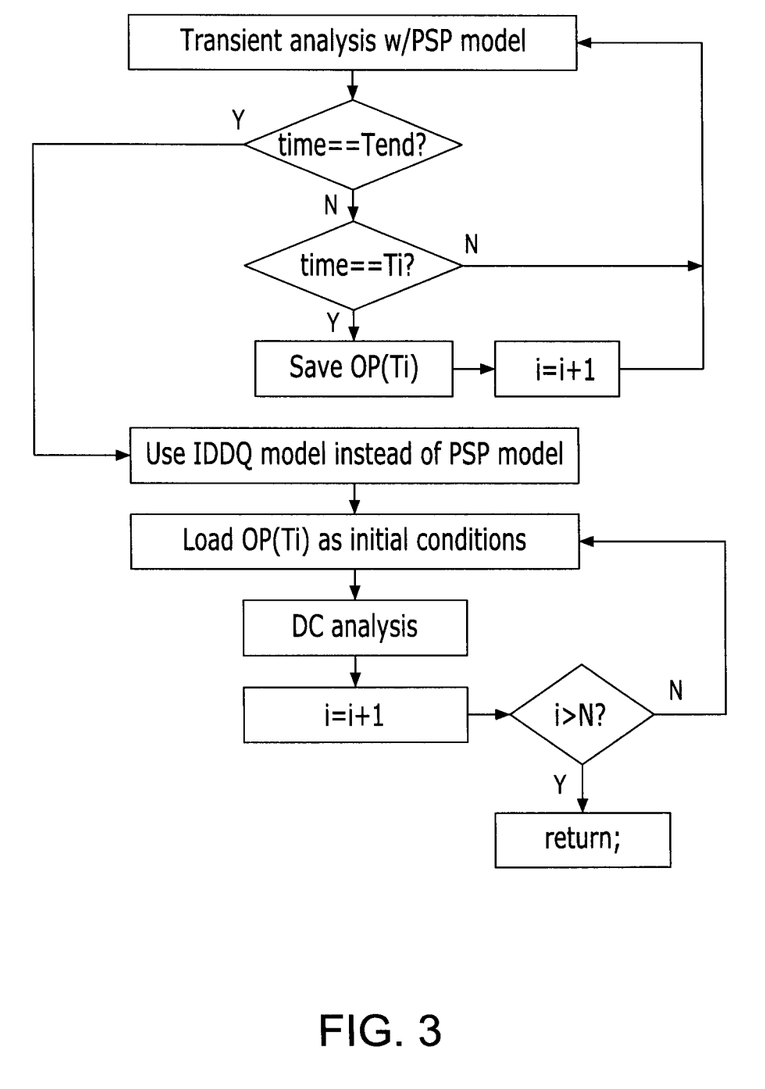
FIG. 3 is a flow chart of a second embodiment of the invention.

In a second embodiment, referenced as Method 2, the DC analysis instruction in line 15 of FIG. 1 is used with reference to FIG. 3 where the simulator saves the instantaneous operating point OP(Ti) at times T0, T1, ..., TN during the transient simulation. Upon termination of the transient simulation with the PSP model, the simulator proceeds to running N+1 DC analyses with the IDDQ model using OP(Ti) as initial conditions. Unlike present simulators, power supply and stimuli commands are redefined using the values loaded from the initial conditions. It is worth noting that it distinctly differs from the way simulators presently prioritize power supply and stimuli definitions over the initial conditions. Thus, in the present embodiment, in the particular context of the DC analysis instruction in line 15 (FIG. 1), node voltages of power supplies and stimuli as found in the initial conditions from OP(Ti) take priority over the power supply and stimuli definitions in the netlist.

An advantage of the first embodiment (Method 1) is that, e.g., logic state and leakage current conditions in principle can be monitored in real time during simulation execution and favorably acted upon. Therefore, the circuit designer can decide when certain logic or leakage conditions occur, whether to stop the simulation and still obtain the leakage current value as well. This cannot be achieved with Method 2, and it is of particular importance for slow or long simulations. Moreover, in Method 1, the programmed simulation time can be made very large without risking to waste unnecessary execution runtime following when, e.g., a critical leakage condition has been observed. In contrast, with Method 2 the designer must wait until the entire simulation has been completed before determining if a critical leakage condition occurred. By way of example, assuming that the runtime of the simulation took one hour, and the designer determines that the critical leakage condition occurred after only 10 minutes, the remaining 50 minutes of runtime are wasted.

In both of the aforementioned embodiments, the simulator only error checks the circuit when the circuit topology changes, such as when a capacitor is replaced with an inductor. However, replacing a capacitor model A with another capacitor model B or replacing a FET model C with another FET model D do not constitute a change in the circuit topology, according to the present definition. Therefore, when replacing the PSP compact FET model with an IDDQ leakage FET model, the swap does not constitute a topology change. Thus, the error checking is not repeated in that instance. The only time the circuit is error checked occurs at the start of the simulation after the circuit has been read in, but prior to any analysis, i.e., when the error checking is executed at the top level of the simulation. Note that even at the top level, the circuit should be error checked if the result of the error checking from a previous simulation execution cannot be found, or when the result does not reflect the same circuit topology.

It is worth noting that some risk exists that is associated with omitting error checking a model which is not built into the simulator, e.g., the Verilog-A model. The risk exists because in principle the simulator cannot determine with certainty whether the Verilog-A based IDDQ model is a FET model with the same topology, and its functionality is based on the built-in PSP FET model. Furthermore, developers of circuit simulation software generally view Verilog-A models as non-trusted components and prefer to handle such models as a black box. Thus, for safety considerations, simulators presently error check the Verilog-A FET model that replaced another FET model. In an embodiment of the present invention, the designer should have the ability to instruct the simulator to trust the Verilog-A model and let the simulator know what kind of device, e.g., a FET, the Verilog-A model represents.

Figure 4:
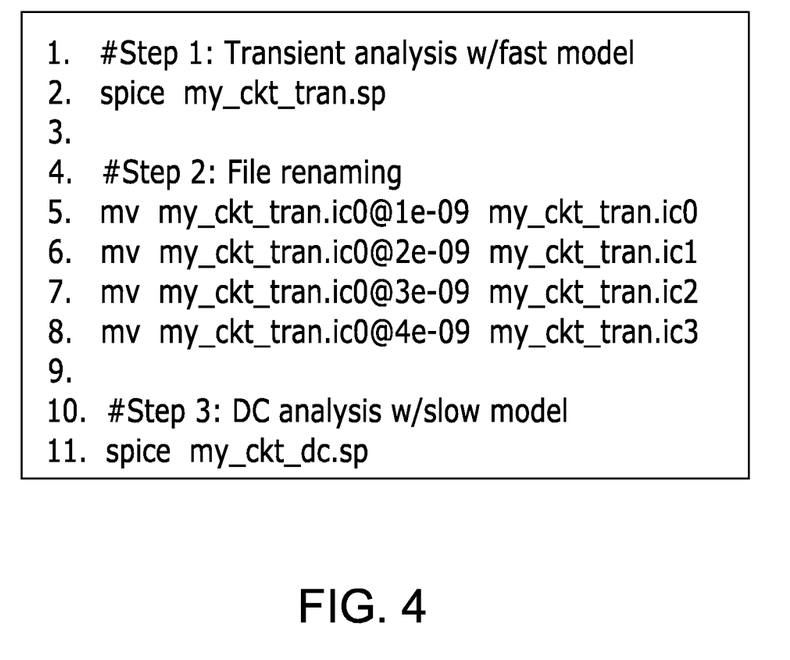
FIG. 4 illustrates a netlist of a best mode of operation of an embodiment of the invention.

In the optimum mode of operation of an embodiment of the invention, a shell script is illustrated with reference to FIG. 4, directing the execution in a sequential manner. The shell script first executes a transient analysis in a SPICE simulation in line 2. It then performs a file renaming step in lines 5-8 and the execution of a DC analysis in the SPICE simulation (line 11). In FIG. 4, "my_ckt_tran.sp" and "my_ckt_dc.sp" refer to file names of SPICE netlists and "move <fn1><fn2>" refer to a shell script command that renames a file named <fn1> to a file named <fn2>. In this regard, the optimum mode of operation is functionally similar to the second embodiment (Method 2) in that initially the transient analysis runs to completion, and then performs the DC analysis.

Figure 5:
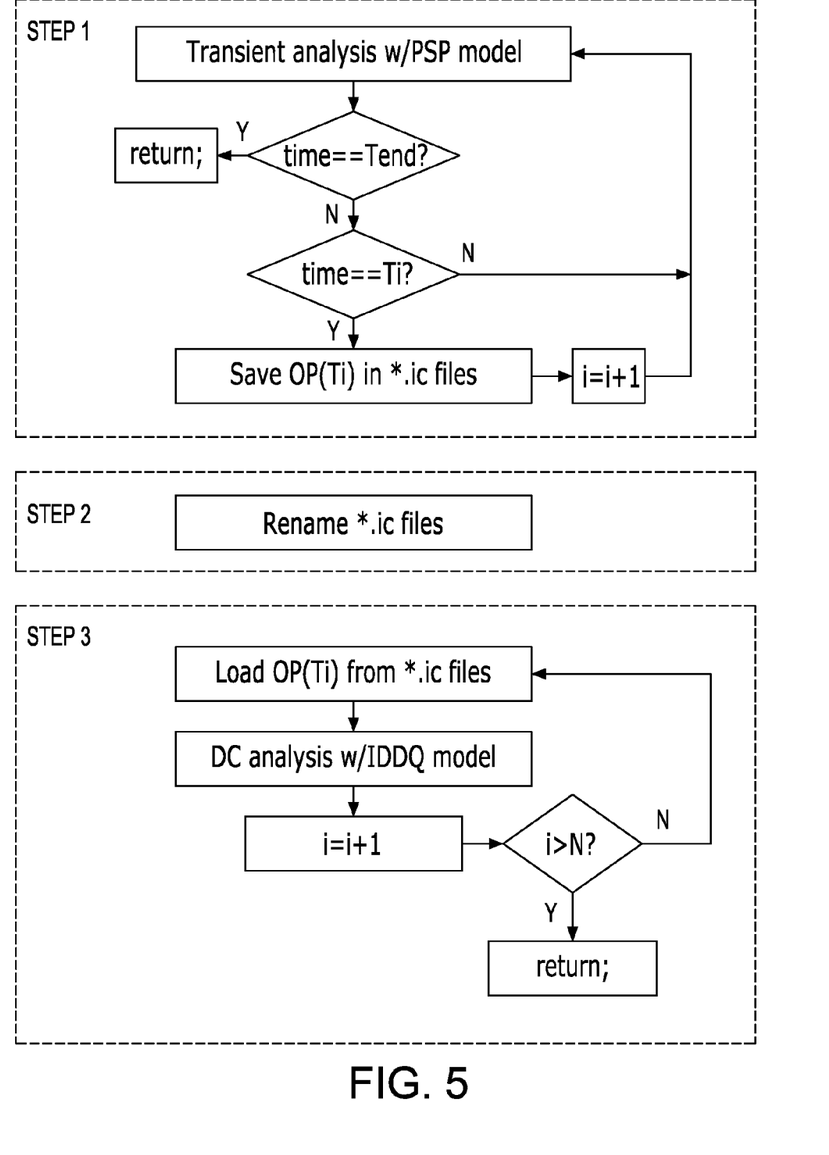
FIG. 5 is a flow chart showing the best model of operation of an embodiment of the invention.

FIG. 5 is a flowchart showing the best mode of operation. Referring to step 1, a transient analysis is preferably run with the compact FET PSP model built into the simulator. The PSP model executes significantly faster than the IDDQ leakage model. The transient analysis applies various pulse stimuli to the circuit. The transient analysis further saves the instantaneous operating conditions, OP(Ti), at predetermined times, T0, T1, ..., Ti, ..., TN, which represent times of some logic state <i> where the logic signal level is reasonably stabilized. Each set of operating conditions is saved in so-called initial condition (IC) files referenced to my_ckt_tran.ic0$<Ti>. Upon completion of the simulation, control returns to the shell script at which point, i.e., in step 2, the IC files are renamed to my_ckt_tran.ic<i> because it is a file extension notation expected in the following DC analysis step. Finally, in step 3, a DC analysis is run using the IDDQ leakage FET model, preferably implemented in a high-level programming language, e.g., Verilog-A. In the DC analysis in step 3, the stimuli associated with each logic state <i> in the transient analysis are replicated as a power supply element in ".alter" statements and the IC files are loaded successively starting from mytran.ic0 to my_ckt_tranic<N>.

Loading the initial conditions in the DC analysis enables putting the circuit node voltages close to the relevant logic state, causing the simulator to only require a couple of iterations before converging on the DC solution. The overall effect is a potentially significant reduction of the runtime in order to obtain the IDDQ leakage of the logic state as compared to obtaining the same information from running the IDDQ model entirely in a transient analysis.

Figure 6:
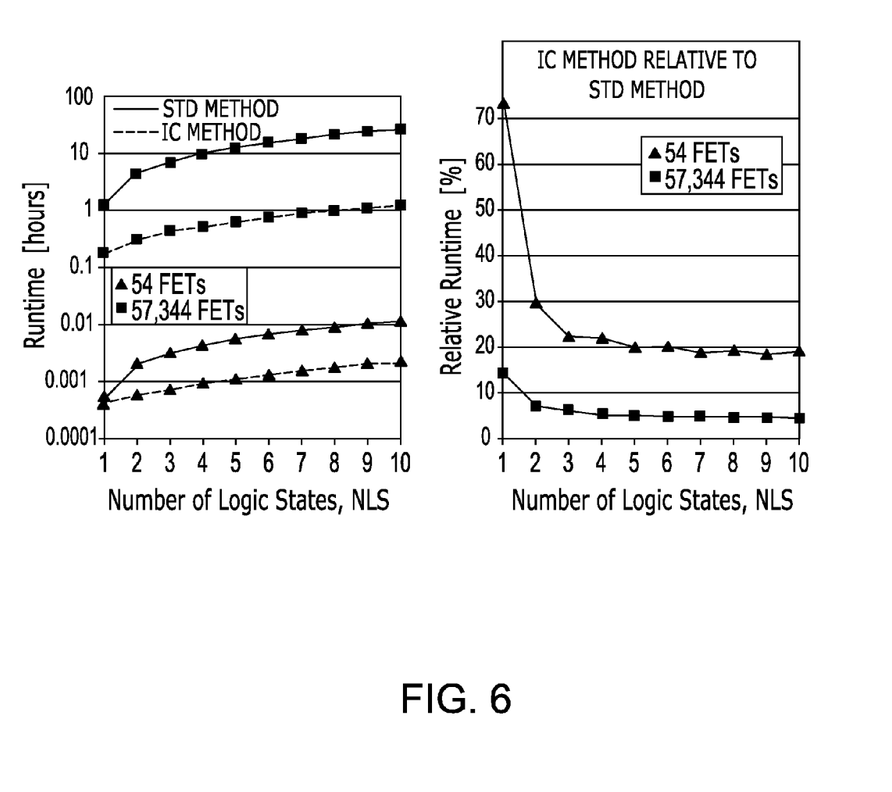
FIG. 6 shows a graphical representation of how much runtime improvement can be achieved with the improved model of operation.

FIG. 6 illustrates the runtime improvement when using the optimum mode of operation. The embodiment of the optimum mode of operation is referred to as the "IC method" (IC, initial conditions) while running the IDDQ model entirely in a transient simulation referred to "STD method" (STD, standard). The left side of the plot shown in FIG. 6 illustrates the absolute simulation runtime. On the right side plot, the relative runtime, i.e., the "IC method"/"STD method"×100%" is shown. Runtimes are preferably plotted as a function of the number of logic states being examined, more particularly, for two different circuit sizes of a scalable circuit suitably representative of the logic circuits. As seen, the runtime of the IC method can be improved by up to 23×s over the STD method. It is anticipated that once the embodiment of the invention is made to work entirely within the simulator, as shown in FIGS. 1, 2 and 3, the runtime can be further improved. Furthermore, the writing of the simulation netlist is significantly simplified.

It is to be understood, that more than two models can be swapped and more than two analyses can be considered during or after the main analysis, e.g., the transient analysis in the preferred embodiments. Furthermore, other analyses besides a DC analysis can be run during or after the transient analysis, for example, an AC analysis or even another transient analysis. Moreover, the first transient analysis can also be some other time-based analysis, such as an AC analysis, but is not limited thereto. Circuit conditions, such as power supply values, temperature, and the like, and simulator settings, including accuracy, measure commands, and the like, may be analysis specific, but they are not restricted to them. The operating conditions OP(Ti) of the initial transient simulation with, e.g., the PSP model, can possibly be used with runtime advantage in the DC analysis step, even if the PSP model itself is being used in the DC analysis, as opposed to the IDDQ model. This is particularly true when running M PVT corners in the simulation, where only the operating point of the typical nominal case needs to be obtained once and can be used for all M corner runs. Correspondingly, the first and secondary analyses, e.g., the transient and DC analyses of embodiments of the invention, can be run using the same compact model. This, however, is not a requirement of the present invention since different models can be used advantageously in different analyses.

The present invention can be realized in hardware, software, or a combination of hardware and software. The present invention can be realized in a centralized fashion in one computer system or in a distributed fashion where different elements are spread across several interconnected computer systems. Any kind of computer system—or other apparatus adapted for carrying out the methods described herein—is suitable. A typical combination of hardware and software could be a general purpose computer system with a computer program that, when being loaded and executed, controls the computer system such that it carries out the methods described herein.

The present invention can also be embedded in a computer program product, which comprises all the features enabling the implementation of the methods described herein, and which—when loaded in a computer system—is able to carry out these methods.

Computer program means or computer program in the present context mean any expression, in any language, code or notation, of a set of instructions intended to cause a system having an information processing capability to perform a particular function either directly or after conversion to another language, code or notation and/or reproduction in a different material form.

While the present invention has been particularly described in conjunction of illustrative embodiments, it is to be understood that one of ordinary skill in the art can extend and apply this invention in many obvious ways. Other embodiments of the invention can be adapted thereto. It is evident that many alternatives, modifications and variations will be apparent to those skilled in the art in light of the present description. It is therefore contemplated that the appended claims will embrace any such alternatives, modifications and variations as falling within the true scope and spirit of the present invention.

What is claimed is:

1. A method for performing a circuit simulation that dynamically swaps between DC and transient analysis types and while simultaneously switching compact models for one or more circuit components, the method comprising:
   a) setting an index to select a predetermined time;
   b) using a computer, running a first time based said transient analysis using a first set of compact models until reaching the predetermined time and saving operating circuit conditions at said predetermined time;
   c) on reaching the predetermined time, suspending said first time based transient analysis, loading said saved operating circuit conditions as initial conditions for a second DC analysis with a second set of compact models, and running said second DC analysis to completion;
   d) updating the index to select another predetermined time; and
   e) repeating steps b) through d) until terminating said first time based transient analysis,
   wherein said first and second sets of compact models are simultaneously loaded into a memory at a top level of said circuit simulation before an onset of said first time based transient analysis, said first and second sets of compact models coexisting in said memory;
   wherein a circuit error checking is performed once for said first time based transient analysis with said first set of compact models at said top level of said circuit simulation;
   wherein said error checking is omitted when switching from said first time based transient analysis to said second DC analysis;
   wherein said error checking is omitted for all other subsequent switches between said first time based transient analysis and said second DC analysis; and
   wherein when said second set of compact models presently in a circuit simulator qualifies as a change of a circuit topology, then selectively disqualifying said change of said circuit topology from said second set of compact models as a change of a circuit topology without requiring any further error checking.

2. The method as recited in claim 1, wherein DC analysis instructions comprise node voltages of power supplies and stimuli found in initial conditions from instantaneous operating points at selected times during said transient simulation taking priority over voltage definitions of said power supplies and said stimuli in a net list.

3. The method as recited in claim 1, wherein said error checking occurs only at a start of said circuit simulation following reading said circuit and prior to said analysis.

4. The method as recited in claim 1, wherein said first compact model is a compact FET model.

5. The method as recited in claim 1, wherein said simulation only error checks said circuit when a circuit topology changes and when the changes have not been disqualified from error checking.

6. The method as recited in claim 1, wherein in said step b) said first time based analysis further comprises saving a timing base execution context (TAEC) in a TAEC memory block.

7. The method as recited in claim 6, wherein said step of returning from step c) to step a) further comprises restoring said TAEC and said operating conditions before resuming said first time based analysis from where it was suspended.

8. The method of claim 1, further comprising;
   identifying a first set of compact models, and error checking a topology of said circuit in which said first set of compact models is a component thereof, wherein
   if said circuit topology was error checked, a result of said error checking is used, and
   if said circuit topology was not error checked, then said error checking is performed, saving the results of said error checking;
   switching from said first set of compact models to said second set of compact models within said circuit; and
   using said saved error checking results of said circuit topology in which said first set of compact models is a component thereof, eliminating repetitive error checking.

9. The method of claim 1, wherein step c) is eliminated and further comprising:
   step f) following step e), running a second analysis for each said predetermined time and corresponding said saved operating conditions.

10. The method of claim 1, wherein reading into memory is organized in a main circuit object pointing to an interconnection matrix of circuit components, and further comprising component objects pointing to specific individual model objects.

11. The method as recited in claim 1 wherein performing the first circuit simulation of the one or more circuit components is followed by performing a second circuit simulation of the one or more circuit components wherein the one or more circuit components is error checked in the second circuit simulation when an error checking of the one or more circuit components from the first circuit simulation execution cannot be found or when the error checking is from a different circuit topology.

12. The method as recited in claim 1 wherein said circuit error check occurs at a start of said simulation after said circuit has been read in but prior to any analysis.

13. A system for performing a circuit simulation that dynamically swaps between DC and transient analysis types and while simultaneously switching compact models for one or more circuit components, comprising:
   a) using a non-transitory computer usable storage medium, setting an index to select a predetermined time;
   b) running a first time based transient analysis using a first set of compact models until reaching the predetermined time and saving operating circuit conditions at said predetermined time;
   c) on reaching the predetermined time, suspending said first time based transient analysis, loading said saved operating circuit conditions as initial conditions for a second DC analysis with a second set of compact models, and running said second DC analysis to completion;
   d) updating an index to select another predetermined time; and
   e) repeating steps b) through d) until terminating said first time based transient analysis;
   wherein said first and second sets of compact models are simultaneously loaded into a memory at a top level of said circuit simulation before an onset of said first time based transient analysis, said first and second sets of compact models coexisting in said memory;
   wherein a circuit error checking is performed once for said first time based transient analysis with said first set of compact models at said top level of said circuit simulation;
   wherein said error checking is omitted when switching from said first time based transient analysis to said second DC analysis;
   wherein said error checking is omitted for all other subsequent switches between said first time based transient analysis and said second DC analysis; and
   wherein when said second set of compact models presently in a circuit simulator qualifies as a change of a circuit topology, then selectively disqualifying said change of said circuit topology from said second set of compact models as a change of a circuit topology without requiring any further error checking.

* * * * *